United States Patent
Porto et al.

(10) Patent No.: US 11,296,910 B2
(45) Date of Patent: Apr. 5, 2022

(54) METHOD OF COMPENSATING ELECTROMAGNETIC EMISSIONS, CORRESPONDING CIRCUIT AND DEVICE

(71) Applicant: STMicroelectronics S.r.l., Agrate Brianza (IT)

(72) Inventors: Domenico Massimo Porto, Catania (IT); Giovanni Luca Torrisi, Catania (IT); Ignazio Testoni, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 218 days.

(21) Appl. No.: 16/800,733

(22) Filed: Feb. 25, 2020

(65) Prior Publication Data
US 2020/0287755 A1      Sep. 10, 2020

(30) Foreign Application Priority Data
Mar. 8, 2019   (IT) .................. 102019000003435

(51) Int. Cl.
  *H04L 25/03*    (2006.01)
  *H04B 17/345*    (2015.01)
  (Continued)

(52) U.S. Cl.
  CPC ........ *H04L 25/03828* (2013.01); *H03M 1/12* (2013.01); *H04B 17/345* (2015.01); *H04L 12/40* (2013.01); *H04L 2012/40215* (2013.01)

(58) Field of Classification Search
  CPC ............... H04L 12/40; H04L 25/03828; H04L 2012/40215; H04B 17/345; H03M 1/12
  See application file for complete search history.

(56) References Cited

U.S. PATENT DOCUMENTS

2010/0148791 A1*   6/2010   Oldenburg ........... G01R 31/008
                                                                    324/523
2012/0014416 A1*   1/2012   Dabiri ................ H03H 21/0021
                                                                    375/144
(Continued)

FOREIGN PATENT DOCUMENTS

| CN | 207504888 U | 6/2018 |
|---|---|---|
| DE | 102011087910 A1 | 2/2013 |
| EP | 1416632 A1 | 5/2004 |

OTHER PUBLICATIONS

Deloge, Matthieu et al., "A Highly-Digitized Automotive CAN Transceiver in 0.14um High-Voltage SOI CMOS", IEEE Proceedings of the 10th International Workshop on Electromagnetic Compatibility of Integrated Circuits (EMC Compo), Nov. 10-13, 2015, 5 pages.

*Primary Examiner* — Brian P Cox
(74) *Attorney, Agent, or Firm* — Slater Matsil, LLP

(57) ABSTRACT

A method of compensating electromagnetic emissions of a device for use in a communication bus, the method including: transmitting a test signal over the communication bus; receiving, at the device, the test signal after propagation over the communication bus; performing frequency analysis processing of the test signal received to detect a set of harmonic components of the test signal received having an amplitude exceeding a certain threshold; storing respective values of frequency of harmonic components in the set of harmonic components having an amplitude exceeding the certain threshold; and generating and transmitting over the communication bus a set of compensation signals, each compensation signal in the set of compensation signals being a sinusoidal signal having a respective frequency equal to one of the frequencies stored, and being in anti-phase with respect to the harmonic component of the test signal received having the respective frequency.

20 Claims, 2 Drawing Sheets

(51) Int. Cl.
*H03M 1/12* (2006.01)
*H04L 12/40* (2006.01)

(56) References Cited

U.S. PATENT DOCUMENTS

2014/0056337 A1  2/2014 Kesling et al.
2014/0133321 A1* 5/2014 Luong ................. H04B 17/104
                                                     370/252
2019/0066653 A1* 2/2019 Speidel ............... B62D 5/0463

* cited by examiner

METHOD OF COMPENSATING ELECTROMAGNETIC EMISSIONS, CORRESPONDING CIRCUIT AND DEVICE

CROSS-REFERENCE TO RELATED APPLICATIONS

This application claims priority to Italian Patent Application No. 102019000003435, filed on Mar. 8, 2019, which application is hereby incorporated herein by reference.

TECHNICAL FIELD

The present disclosure relates generally to an electronic system and method, and, in particular embodiments, to method of compensating electromagnetic emissions, corresponding circuit and device.

BACKGROUND

Controller Area Network (CAN) bus is a type of two wire differential bus widely used in the automotive sector. Devices for use in a CAN bus typically comprise a CAN transceiver for coupling to the CAN bus for transmitting and/or receiving signals, with such signals being encoded according to various protocols to carry messages.

Electromagnetic compatibility (EMC) requirements for automobile manufacturers in Europe (as defined by the *Ingenieurbüro für Industrielle Elektrotechnik*, IBEE-Zwickau), which apply also to CAN transceivers, indicate that electromagnetic emissions in the range of frequency between 0.6 MHz and 10 MHz should be lower than 55 dB.

For instance, when transmitting over a CAN bus a square wave test signal TS1 having a frequency of 250 kHz and an amplitude of 1 µV, any resulting signal in the CAN bus having a frequency between 0.6 MHz and 10 MHz should have an amplitude lower than 562 µV.

In some cases, CAN devices may fail to comply with such EMC requirements. For instance, a few harmonic components (e.g., 2 or 3 harmonics) of the test signal TS1 may exceed the threshold of 55 dB in the frequency range 0.6 MHz to 10 MHz.

Since compliance to EMC requirements is typically tested after completion of the design phase of a CAN device, failing to comply with such requirements may result in an expensive and time consuming re-design of the CAN device and/or the CAN transceiver, in particular involving re-design of the input/output pin configuration of the CAN transceiver.

Other known solutions for complying with EMC requirements involve coupling a filtering capacitor at the output of the CAN transceiver, which may still not be sufficient to provide satisfactory EMC performance of the device.

SUMMARY

Despite the extensive activity in the area, further improved solutions are desirable.

Some embodiments relate to methods for compensating electromagnetic noise. Some embodiments relate to a corresponding circuit. Some embodiments relate to a corresponding device.

One or more embodiments may be applied to compensating electromagnetic noise in buses, e.g., such as CAN buses.

Some embodiments improve electromagnetic compatibility of CAN devices to reduce the risk of failing to comply with automotive EMC requirements.

One or more embodiments may relate to a device comprising a CAN transceiver and other circuits (such as, for instance, oscillators and analog-to-digital converters), wherein the circuits are configured to perform noise compensation on the CAN bus in addition to their normal operation.

As mentioned above, various embodiments of the present disclosure may relate to a method of compensating electromagnetic emissions of a device for use in a CAN bus, the device comprising a CAN transceiver coupling the device to the CAN bus for transmitting and receiving signals.

In various embodiments, the method comprises:

transmitting a test signal over the CAN bus, receiving, at the device, the test signal after propagation over the CAN bus, performing frequency analysis processing of the test signal received to detect a set of harmonic components of the test signal received having an amplitude exceeding a certain threshold, storing respective values of frequency of harmonic components in the set of harmonic components having an amplitude exceeding the certain threshold, and generating and transmitting over the CAN bus a set of compensation signals, each compensation signal in the set of compensation signals being a sinusoidal signal having a respective frequency equal to one of the frequencies stored, and being in anti-phase with respect to the harmonic component of the test signal received having the respective frequency.

In various embodiments, performing frequency analysis processing comprises applying superheterodyne processing to the test signal received by:

sequentially generating a set of sinusoidal signals at different frequencies, mixing each of the sinusoidal signals sequentially generated with the test signal received after propagation over the CAN bus, thereby sequentially generating a set of mixed signals, and applying band-pass filtering at a fixed frequency to the mixed signals in the set of mixed signals, thereby sequentially detecting the set of harmonic components of the test signal received.

In various embodiments, storing respective values of frequency of harmonic components in the set of harmonic components having an amplitude exceeding the certain threshold comprises:

checking whether a new value of frequency candidate for storage is equal to $2^N * f_o$, with N being an integer and $f_o$ being any of the previously stored values of frequency, and storing the new value of frequency candidate for storage as a result of the new value of frequency candidate for storage not being equal to $2^N * f_o$.

In various embodiments, storing respective values of frequency of harmonic components in the set of harmonic components comprises:

configuring an analog-to-digital converter in the device to receive at input the harmonic signals and to provide at output a digital signal indicative of the respective values of frequency, and storing the respective values of frequency in a register in the device.

In various embodiments, the method further comprises:
checking whether the register in the device is full, and
terminating the frequency analysis processing as a result of the register in the device being full, or as a result of the frequency of a lastly generated sinusoidal signal in the set of sequentially generated sinusoidal signals being higher than a certain frequency threshold.

In various embodiments, generating and transmitting over the CAN bus the set of compensation signals comprises:
estimating a phase difference between at least one of the generated compensation signals and a corresponding one of the harmonic components of the test signal received, and
adjusting a phase of the at least one of the generated compensation signals as a function of the estimated phase difference to keep the at least one of the generated compensation signals in anti-phase with respect to the corresponding one of the harmonic components of the test signal received.

In various embodiments, the method further comprises storing respective values of amplitude of harmonic components in the set of harmonic components of the test signal received having an amplitude exceeding the certain threshold, and each compensation signal in the set of compensation signals transmitted over the CAN bus has a respective amplitude which is a function of an amplitude of the corresponding harmonic signal of the test signal received having the respective frequency, preferably with the respective amplitude being equal to the amplitude of the corresponding harmonic signal of the test signal received having the respective frequency.

In various embodiments, the test signal is a pulse wave test signal at a frequency of 250 kHz, in particular a square wave with a duty cycle of 50% and an amplitude between 0.1 µV and 10 µV, preferably equal to 1 µV.

In various embodiments, the test signal is generated in the device by:
generating, with an oscillator circuit, a sinusoidal signal having a frequency of 2 MHz,
performing frequency division of the sinusoidal signal having a frequency of 2 MHz, thereby generating a second sinusoidal signal having a frequency of 250 kHz, and
providing the second sinusoidal signal at the input of a comparator, the comparator configured to generate an output signal indicative of the sign of the second sinusoidal signal.

In various embodiments, the certain amplitude threshold is a ratio between the amplitude of the harmonic component of the test signal received and the amplitude of the test signal transmitted over the CAN bus, the ratio being preferably equal to 55 dB.

In various embodiments, the steps of:
transmitting a test signal over the CAN bus,
receiving the test signal after propagation over the CAN bus,
performing frequency analysis processing of the test signal received, and
storing respective values of frequency of harmonic components in the set of harmonic components,
are performed at the start-up of the CAN bus, and the step of generating and transmitting over the CAN bus a set of compensation signals is performed continuously during operation of the CAN bus.

Various embodiments may relate to a circuit for compensating electromagnetic emissions of a device for use in a CAN bus according to one or more embodiments, the device comprising a CAN transceiver coupling the device to the CAN bus for transmitting and receiving signals, wherein the circuit comprises:

test signal generation circuitry configured to generate a test signal for the CAN bus,
at least one CAN transceiver configured to transmit the test signal over the CAN bus, and to receive the test signal after propagation over the CAN bus,
frequency analysis processing circuitry configured to detect a set of harmonic components of the test signal received having an amplitude exceeding a certain threshold,
at least one register configured to store respective values of frequency of harmonic components in the set of harmonic components having an amplitude exceeding the certain threshold, and
compensation signal generating circuitry configured to generate a set of compensation signals, each compensation signal in the set of compensation signals being a sinusoidal signal having a respective frequency equal to one of the frequencies stored, and being in anti-phase with respect to the harmonic component of the test signal received having the respective frequency.

In various embodiments, the test signal generation circuitry comprises:
a first oscillator configured to generate a first sinusoidal signal at a certain first frequency,
a frequency divider circuit configured to receive the first sinusoidal signal and to generate therefrom a second sinusoidal signal at a certain second frequency, lower than the certain first frequency, and
a first comparator configured to generate a pulse wave test signal as a function of the second sinusoidal signal at the certain second frequency.

In various embodiments, the frequency analysis processing circuitry comprises:
a second oscillator configured to sequentially generate a set of sinusoidal signals at different frequencies,
a mixer circuit configured to mix each of the sinusoidal signals sequentially generated with the test signal received after propagation over the CAN bus, thereby sequentially generating a set of mixed signals,
a band-pass filter centered at a certain fixed frequency configured to filter the mixed signals in the set of mixed signals, thereby sequentially detecting the set of harmonic components of the test signal received,
a second comparator configured to compare the amplitude of harmonic components in the set of harmonic components to a certain amplitude threshold,
an analog-to-digital converter configured to receive at input the harmonic signals and to provide at output a digital signal indicative of the respective values of frequency, and
a register configured to store the respective values of frequency.

In various embodiments, a circuit comprises a phase difference estimation circuit configured to estimate a phase difference between at least one of the generated compensation signals and a corresponding one of the harmonic components of the test signal received, and the compensation signal generating circuitry is configured to adjust a phase of the at least one of the generated compensation signals as a function of the estimated phase difference to keep the at least one of the generated compensation signals in anti-phase with respect to the corresponding one of the harmonic components of the test signal received.

Various embodiments may relate to a device for use in a CAN bus comprising a circuit according to one or more embodiments.

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

Figure 1:
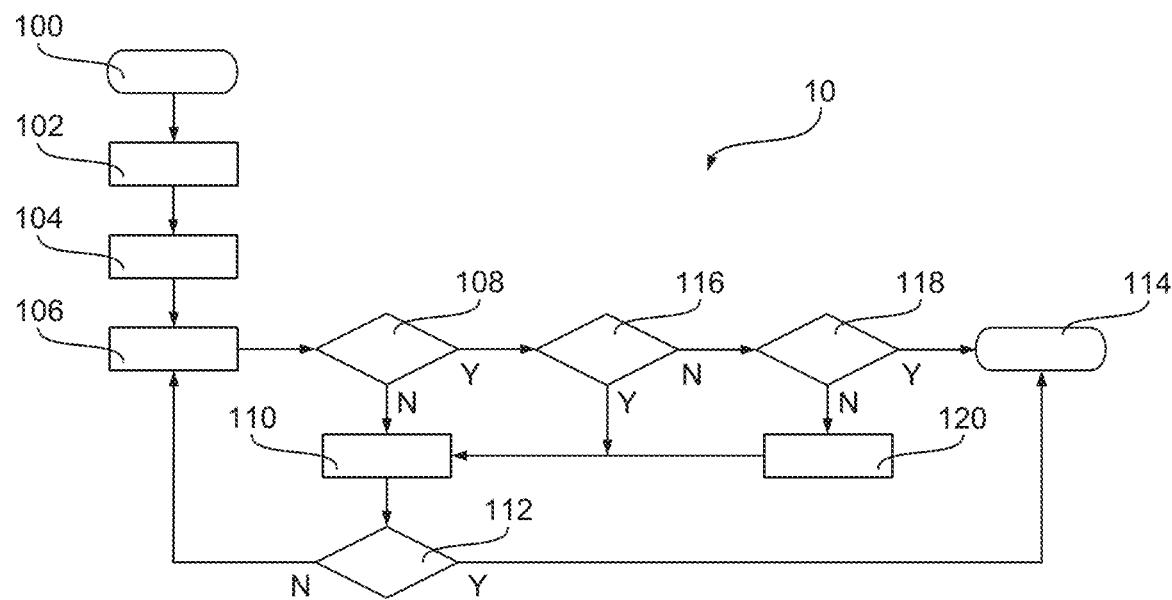
FIG. 1 is a block diagram exemplary of a frequency analysis procedure according to one or more embodiments.

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

Throughout the figures annexed herein, like parts or elements are indicated with like references/numerals and a corresponding description will not be repeated for brevity.

The references used herein are provided merely for convenience and hence do not define the extent of protection or the scope of the embodiments.

As previously described, devices designed for cooperation with a communication bus (e.g., a CAN bus) may fail to comply with EMC requirements insofar as one or more harmonics of a test signal transmitted over the bus (such as the test signal TS1 discussed above, i.e., a square wave signal at 250 kHz and with duty cycle equal to 50%) may exceed the threshold of 55 dB in the frequency range from 0.6 MHz to 10 MHz.

Therefore, one or more embodiments may involve compensating such "faulty" harmonics (also referred to as harmonic components or harmonic signals in the present description) by:

transmitting over a bus (e.g., a CAN bus), from a device coupled to the bus via a transceiver, a test signal such as TS1, receiving, at the device, the test signal after propagation over the bus, performing frequency analysis of the test signal received to detect a set of harmonic signals of the test signal received having an amplitude exceeding a certain threshold, storing the values of frequency of signals in the set of harmonic signals having an amplitude exceeding the threshold, and generating and transmitting over the bus a set of compensation signals, each compensation signal being a sinusoidal signal having a frequency equal to one of the frequencies stored, and being in anti-phase with respect to the corresponding harmonic signal having that same frequency.

In the present detailed description, reference will be made to a specific example of a Controller Area Network (CAN) bus by way of simplicity only. One or more embodiments may be applied to other types of communication buses as well.

A method according to one or more embodiments may thus comprise a first phase, wherein a frequency analysis procedure of a CAN bus is performed to detect "faulty" harmonics, and a second phase, wherein compensation of faulty harmonics detected during the first phase is performed.

In particular, FIG. 1 is a block diagram exemplary of a frequency analysis procedure 10 according to one or more embodiments.

In the example considered herein, the procedure 10 starts at a start step 100. At a step 102, the procedure 10 comprises generating a test signal TS1 (e.g., a square wave signal with duty cycle equal to 50% and frequency equal to 250 kHz), and transmitting the test signal TS1 over a CAN bus, the CAN bus being coupled to a device under test comprising a CAN transceiver.

In one or more embodiments, the test signal TS1 may be generated internally to the device under test and may be transmitted over the CAN bus via the CAN transceiver. Alternatively, the test signal TS1 may be generated by a different device coupled to the CAN bus. In any case, the test signal will propagate over the CAN bus and will be received at the CAN transceiver of the device under test after propagation over the CAN bus.

At a step 104, the procedure 10 comprises generating a first sinusoidal signal having a frequency f' equal to the lowest frequency for which EMC compatibility of the device is being tested, e.g., f'=10 kHz. The first sinusoidal signal may be generated internally to the device under test, e.g., by an oscillator such as a voltage controlled oscillator (VCO).

At a step 106, the procedure 10 comprises detecting the amplitude of the harmonic component at frequency f' of the test signal received at the CAN transceiver after propagation over the bus. In particular, step 106 may involve processing the test signal received at the CAN transceiver and the first sinusoidal signal at frequency f' according to a superheterodyne processing scheme known per se, wherein:

the test signal received at the CAN transceiver and the first sinusoidal signal at frequency f' are mixed in a mixer circuit, and the output from the mixer circuit is provided to a bandpass filter having a fixed frequency $f_f$, thereby providing an output signal which is indicative of the harmonic component at frequency f' of the test signal received after propagation over the bus.

Therefore, at step 106, the procedure 10 provides the amplitude of the harmonic component at frequency f' of the propagated test signal. In variant embodiments, processing techniques other than a superheterodyne processing scheme may be employed for providing the amplitude of the harmonic component at frequency f' of the propagated test signal.

At a step 108, the amplitude is compared to a threshold value, which may be defined as a function of the amplitude of the test signal. For instance, the threshold value may be equal to 562 µV in case the amplitude of the test signal is equal to 1 µV, corresponding to a threshold of 55 dB. Of course, such values are purely exemplary and may vary depending on the application and/or requirements of the system.

The amplitude of the harmonic component at frequency f' being lower than the threshold (negative outcome, N, of step 108) may indicate that the EMC requirements are fulfilled by the device at the present frequency f'. Thus, no compensation actions may be taken, and the procedure 10 may comprise increasing the frequency f' of the generated sinusoidal signal at a step 110. For instance, the frequency f' may be increased by 10 kHz at step 110 (with this value being again purely exemplary).

After increasing the value of the frequency f' of the generated sinusoidal signal, a further checking act 112 may be performed. The checking act 112 comprises checking whether the new value of the frequency f' is higher than a certain maximum value, corresponding to the highest frequency for which EMC compatibility is being tested, e.g., 16 MHz.

In case of a negative outcome (N) of the checking act 112, i.e., in case the new value of the frequency f' is lower than the maximum value, the procedure 10 resumes operation from step 106. Thus, the amplitude of the harmonic component at the new frequency f' of the test signal received is detected (e.g., by superheterodyne processing), and such amplitude is again compared to a certain threshold at step 108.

In case of a positive outcome (Y) of the checking act 112, i.e., in case the new value of the frequency f' is higher than the maximum value, the procedure 10 terminates at an end step 114.

On the other hand, a positive outcome (Y) of the comparison act 108 may indicate that the EMC requirements are not fulfilled by the device at the present frequency f'.

If the present frequency f' is the first frequency which does not satisfy the EMC requirements detected during the frequency analysis procedure 10, the value of f' is stored in a first register. Additionally, also the value of amplitude of the corresponding harmonic signal may be stored in a second register.

If the present frequency f' is not the first faulty frequency detected, i.e., in case the first register has at least one entry already stored therein, a further checking act 116 may be performed, wherein the value of the present frequency f' is compared to other value(s) of frequency previously stored in the first register.

The checking act 116 may determine whether the present frequency f' is a multiple of any of the previously stored frequencies, i.e., if f' is equal to $N*f_o$, with N being an integer and $f_o$ being any of the previously stored values of frequency.

Alternatively, the checking act 116 may determine whether the present frequency f' is a multiple of a power of 2 and any of the previously stored frequencies, i.e., if f' is equal to $2^{N}*f_o$, with N being an integer and $f_o$ being any of the previously stored values of frequency.

In case the present frequency f' is a multiple of (a power of 2 and) any of the previously stored frequencies (Y), the procedure 10 may prosecute to step no, without storing the present value of frequency f'. Conversely, in case the present frequency f' is not a multiple of (a power of 2 and) any of the previously stored frequencies (N), a still further checking act 118 may be performed.

The checking act 118 determines whether the register configured to store the values of frequency (and, in preferred embodiments, also the register configured to store the corresponding values of amplitude) is full or not. In case the register is full (Y), the procedure terminates at the end step 114. In case the register is not full (N), the procedure comprises storing the present value of frequency f' in the first register (and, in preferred embodiments, storing also the value of the corresponding amplitude in the second register) at a step 120, and then prosecuting the frequency analysis procedure at step 110.

Therefore, by performing a frequency analysis procedure 10 as exemplified in FIG. 1, a device cooperating with a CAN bus may determine and store values of frequency of harmonics which do not comply with EMC requirements, and preferably may also store the corresponding values of amplitude of such harmonics.

It will be understood that some of the steps of the procedure 10 described with reference to FIG. 1 may be purely optional, such as the checking act 116 and the checking act 118. One or more embodiments may involve storing all values of faulty frequencies (even if multiple of a previously stored one), or may not require to check whether the register(s) is/are full (e.g., in case deep registers are provided in the device).

As previously described, a second phase of a compensation method according to one or more embodiments relates to generating compensation signals in anti-phase with the faulty harmonics detected in the received test signal.

In one or more embodiments, a set of sinusoidal compensation signal(s) may be generated and added (e.g., transmitted) to the CAN bus, with each compensation signal in the set of compensation signals having a frequency equal to one of the values of frequency stored during a frequency analysis procedure as exemplified in FIG. 1. Each compensation signal is phase-shifted of 180° (or π, in radians) with respect to the corresponding (i.e., having the same frequency) harmonic component in the test signal, with an uncertainty Δφ.

Therefore, for a given frequency $f_j$ in the set of stored frequencies, the overall amplitude of the corresponding signal in the CAN bus may be expressed by the following relationship:

$$\sin(2\pi f_j t) + \sin(2\pi f_j t + \pi + \Delta\varphi) = -2\,\sin\!\left(\frac{\Delta\varphi}{2}\right)\cos\!\left(2\pi f_j t + \frac{\Delta\varphi}{2}\right)$$

wherein $\sin(2\pi f_j t)$ is the contribution due to the test signal and $\sin(2\pi f_j t + \pi + \Delta\varphi)$ is the contribution due to the compensation signal.

Thus, the capability of effectively compensating a certain faulty harmonic component at frequency $f_j$ may depend on the phase uncertainty Δφ. One or more embodiments may thus involve a closed loop routine to (continuously) estimate the phase difference between the faulty harmonic signal and the corresponding compensation signal, with the aim of minimizing the phase uncertainty Δφ.

Additionally, in case the phase uncertainty Δφ is negligible, the capability of effectively compensating a certain faulty harmonic component at frequency $f_j$ may depend on the amplitude uncertainty ΔA (i.e., the difference between the amplitude of the faulty harmonic signal and the corresponding compensation signal). For instance, by assuming Δφ=0 and ΔA≠0, the overall amplitude of the signal at frequency $f_j$ in the CAN bus may be expressed by the following relationship:

$$\sin(2\pi f_j t) + (1-\Delta A)\sin(2\pi f_j t + \pi) = \Delta A\,\sin(2\pi f_j t)$$

wherein $\sin(2\pi f_j t)$ is the contribution due to the test signal and $(1-\Delta A)\sin(2\pi f_j t + \pi)$ is the contribution due to the compensation signal.

Thus, in one or more embodiments a compensation signal is added to the background noise of the CAN bus for each frequency $f_j$ stored during a frequency analysis procedure such as 10.

In case the amplitude uncertainty ΔA is negligible, the resulting damping factor of the harmonic at frequency $f_j$ may be expressed by means of the following relationship:

$$G(\Delta\varphi_j) = 20 \log_{10}(\Delta\varphi_j) \text{ dB}$$

For instance, in case ΔA=0 and Δφ=0.1 rad, a damping factor of −20 dB may be obtained. Such a value may be, in most cases, fully satisfactory for complying with EMC requirements.

In certain applications, obtaining a fixed damping factor of −5 dB may be sufficient to overcome any EMC issue. In this condition, it may be useful to determine a maximum allowable value of the phase uncertainty Δφ which may (still supposing that ΔA=0) determine the damping factor to be at least equal to −5 dB, according to the following relationships:

$$G(\Delta\varphi_j) = 20 \log_{10}(\Delta\varphi_j) \text{ dB} = -5 \text{ dB}$$

$$\log_{10}(\Delta\varphi_j) = -0.25$$

$$\Delta\varphi_j = 10^{-0.25} = 0.562 \text{ rad} = 32.2 \text{ deg}$$

Thus, in case ΔA=0, containing the phase uncertainty Δφ below 32.2° may be sufficient to obtain a damping factor of −5 dB.

In other cases, it may be useful to determine a maximum allowable value of the amplitude uncertainty ΔA which may (this time, supposing that Δφ=0) determine the damping factor to be at least equal to −5 dB, according to the following relationships:

$$G(\Delta A) = 20 \log_{10}(\Delta A) \text{ dB} = -5 \text{ dB}$$

$$\log_{10}(\Delta A) = -0.25$$

$$\Delta A = 10^{-0.25} = 0.562$$

Thus, in case Δφ=0, a compensation signal having an amplitude equal to at least 44% of the amplitude of the faulty harmonic component may be sufficient to obtain a damping factor of −5 dB.

Figure 2:
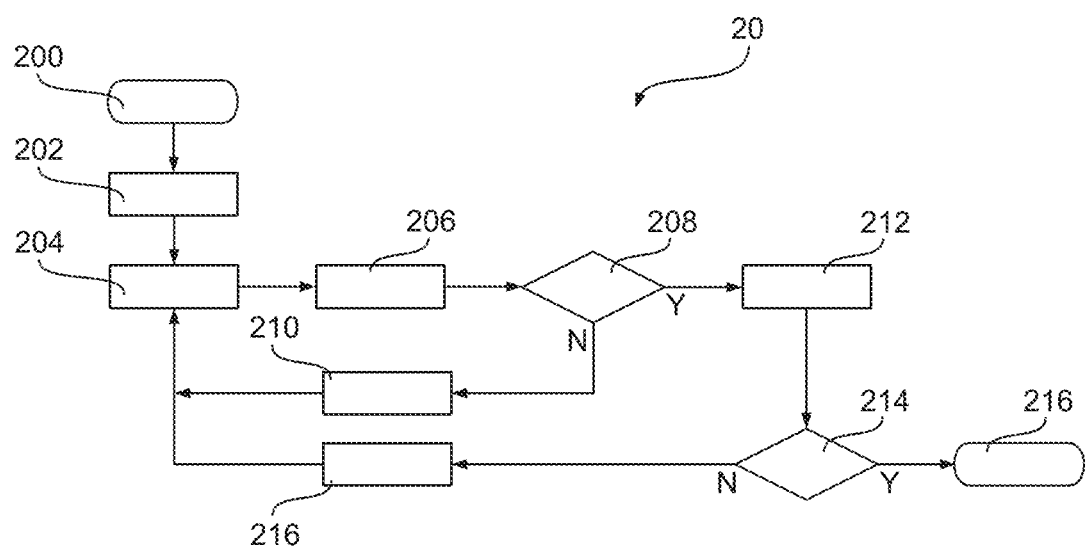
FIG. 2 is a block diagram exemplary of a noise compensation procedure according to one or more embodiments.

FIG. 2 is a block diagram exemplary of a noise compensation procedure 20 according to one or more embodiments.

In the example considered herein, the procedure 20 starts at a start step 200. At a step 202, the noise compensation procedure 20 comprises initializing a compensation signal generator (e.g., an oscillator circuit) by:

setting the frequency of the generated sinusoidal signal to a value $f_j$ equal to a first value stored in the frequency register, and setting the phase $\varphi_j$ of the generated sinusoidal signal so to be phase-shifted of 180° with respect to the corresponding faulty harmonic component.

At a step 204, the procedure 20 comprises generating such compensation signal at frequency $f_j$, and injecting it into the CAN bus.

At a step 206, the procedure 20 comprises determining a real phase shift between the compensation signal and the corresponding faulty harmonic. For instance, multiplying the compensation signal and the corresponding faulty harmonic may generate an output signal having a continuous component having an amplitude proportional to (equal to) $\cos(\Delta\varphi)/2$, Δφ being the uncertainty on the phase shift. Alternatively, subtracting the compensation signal and the corresponding faulty harmonic one from the other may generate an output signal having an amplitude proportional to Δφ.

At a step 208, the procedure 20 comprises checking whether such real phase shift would be acceptable, i.e., whether addition of the compensation signal to the CAN bus would be sufficient to damp the corresponding faulty harmonic and keep it below the threshold specified by EMC requirements, e.g., 55 dB.

As a result of a negative outcome (N) of the checking act 208, the procedure 20 comprises adjusting the phase $\varphi_j$ of the generated sinusoidal signal (e.g., increasing $\varphi_j$) at a step 210 and prosecuting operation from step 204.

As a result of a positive outcome (Y) of the checking act 208, the procedure 20 comprises adding the generated sinusoidal compensation signal to the CAN bus, at a step 212.

After step 212, a step 214 of procedure 20 comprises checking whether the present frequency $f_j$ is the last frequency saved in the first register.

In case $f_j$ is not the last frequency stored (negative outcome, N), a step 216 of procedure 20 comprises re-initializing the compensation signal generator by:

resetting the frequency of the generated sinusoidal signal to a value $f_{j+1}$ equal to a next value stored in the frequency register, and resetting the phase $\varphi_{j+1}$ of the generated sinusoidal signal so to be phase-shifted of 180° with respect to the corresponding faulty harmonic component.

After re-initialization of the compensation signal generator, operation of the procedure 20 resumes from step 204.

Conversely, in case $f_j$ is the last frequency stored in the first register (outcome Y of step 214), the compensation procedure 20 terminates at and end step 218.

Figure 3:
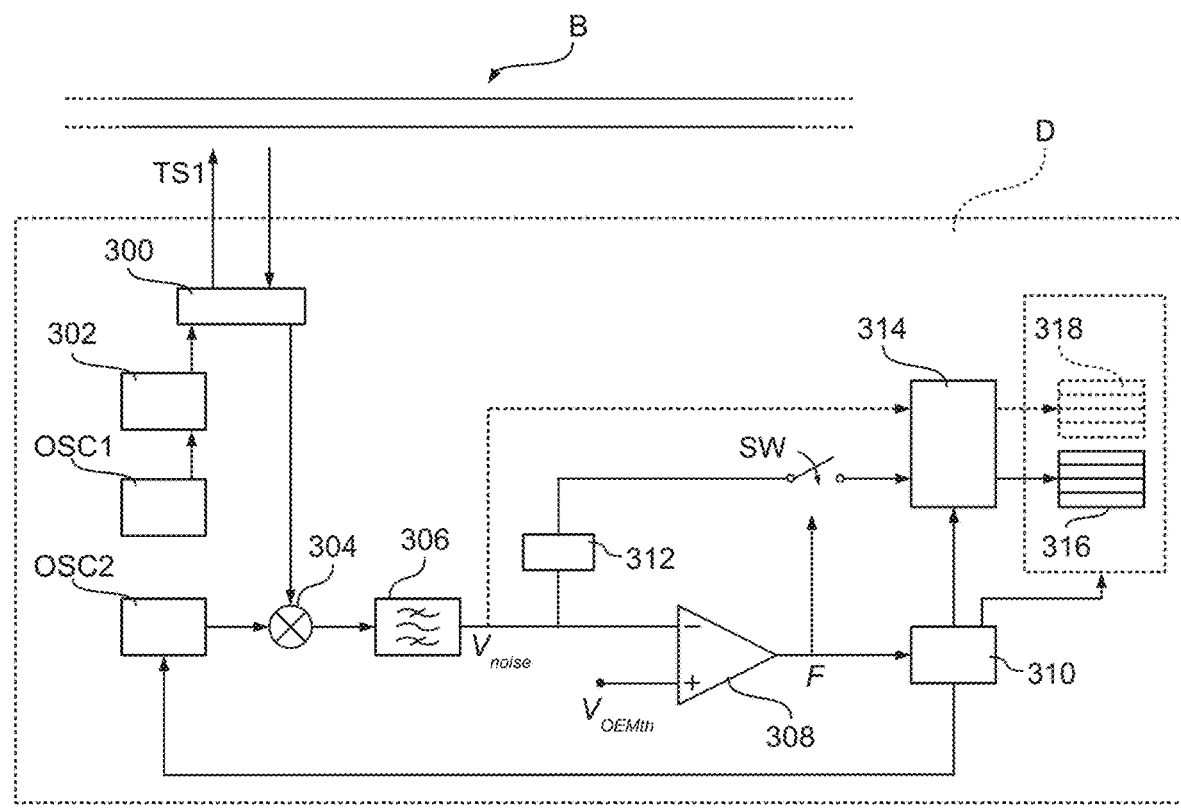
FIGS. 3 and 4 are circuit block diagrams exemplary of implementation details of one or more embodiments.

FIG. 3 is a circuit block diagram exemplary of possible implementation details of a circuit for performing a frequency analysis procedure 10 in a device D under test.

As exemplified in FIG. 3, a device D may be coupled to a CAN bus B by using a CAN transceiver 300.

In order to perform a frequency analysis procedure as exemplified in FIG. 1, the device D may comprise a first oscillator circuit OSC1 which generates a sinusoidal signal, the sinusoidal signal being provided to a circuit block 302 which generates an output square wave as a function of the sign of the sinusoidal signal. In an exemplary implementation, the circuit block 302 may comprise a comparator.

The square wave generated at the output of the circuit block 302 may be provided to the transceiver 300 for propagation over the CAN bus B as a test signal TS1. In particular, the test signal TS1 may have a frequency of 250 kHz, a duty cycle of 50% and an amplitude of 1 µV.

The oscillator circuit OSC1 may generate the sinusoidal signal at 250 kHz. Alternatively, the oscillator circuit OSC1 may generate the sinusoidal signal at a higher frequency (e.g., 2 MHz) with such signal being processed by a frequency divider circuit (e.g., comprised in the circuit block 302) to generate an output signal at 250 kHz. This latter option may allow to reuse an oscillator OSC1 which is already present in the device D, without the need of implementing a dedicated oscillator for the generation of the test signal TS1.

A device D as exemplified in FIG. 3 may also comprise circuitry for performing frequency analysis of the test signal received at the transceiver 300 after propagation over the CAN bus B.

Such circuitry may comprise a second oscillator circuit OSC2 (e.g., a voltage controlled oscillator) which can generate sinusoidal signals at a variable frequency f', e.g., from 10 kHz to 16 MHz in steps of 10 kHz. A mixer circuit 304 may be configured to mix a sinusoidal signal at a certain frequency f' generated by the oscillator OSC2 and the test signal received at the CAN transceiver 300. The output of the mixer circuit 304 may thus be filtered in a band-pass filter 306, centered at a fixed frequency $f_i$.

In brief, the oscillator OSC2, the mixer circuit 304 and the band-pass filter 306 may be configured to perform superheterodyne processing of the test signal received at the CAN transceiver 300, thereby extracting a harmonic component $V_{noise}$ at frequency f' from the test signal received.

A comparator 308 may compare the amplitude of the harmonic component $V_{noise}$ to a threshold value $V_{OEM,th}$ (e.g., 562 µV if the amplitude of the test signal is 1 µV), thereby generating an output logic signal F indicative of whether the harmonic component at frequency f' complies with the EMC requirements (i.e., the threshold is not exceeded) or not (i.e., the threshold is exceeded).

Such logic signal F may be propagated to a logic circuit block 310 and may also trigger switching of an electronic switch SW.

In case the logic signal F indicates that the present harmonic component at frequency f' complies with EMC requirements, the switch SW may be open and the logic block 310 may be configured to act on the oscillator OSC2 to increase the frequency f' and progress in the frequency analysis procedure of the CAN bus.

Conversely, in case the logic signal F indicates that the present harmonic component at frequency f' does not comply with EMC requirements, the switch SW may be closed. A frequency analyzer circuit 312 may be configured to analyze the present harmonic component $V_{noise}$ and provide an output signal indicative of the corresponding frequency f'. For instance, the frequency analyzer circuit 312 may be configured to transmit over the CAN bus a plurality of harmonic components of the square wave test signal TS1 one at a time, and compare the corresponding plurality of signals received from the CAN bus with the threshold value $V_{OEM,th}$ also one at a time. In such case, a counter circuit may be used to indicate which frequency is under analysis at a certain point in time (e.g., because frequencies are distributed in steps of 10 kHz). Additionally or alternatively, the square wave test signal TS1 may be received at the frequency analyzer circuit 312 "as it is" and harmonic components thereof may be selectively filtered (e.g., by applying superheterodyne-like processing).

The signal indicative of the frequency f' of the present harmonic component $V_{noise}$ is propagated to an analog-to-digital converter (ADC) 314 (e.g., an ADC with 10-bit resolution) which generates an output value indicative of the frequency f', with such value being stored in a dedicated register 316 (if the register is not full), e.g., an SPI (Serial Peripheral Interface) register. For instance, if the present frequency f' is equal to 1710 kHz, the value 171 may be generated at the output of the ADC 314 and stored in the register 316.

In one or more embodiments, the ADC 314 may be already present in the device D for different purposes, e.g., for managing temperature signals. Thus, one or more embodiments as exemplified in FIG. 3 advantageously involve reusing a resource (e.g., a circuit core such as the ADC 314) which would be present in the device D anyway, without the need of implementing a dedicated ADC and resulting in a low-cost, low-complexity noise compensation implementation.

The logic circuit 310 may be configured to perform any of the checking acts 108, 116 and/or 118 described with reference to FIG. 1, i.e., checking whether the present harmonic component is a faulty one or not (depending on the value of the logic signal F), checking whether the corresponding frequency f' is a multiple of (a power of 2 and) a frequency already stored in the register 316, and/or checking whether the register 316 is full.

By way of example, a first faulty harmonic may be identified at a frequency f' equal to 1710 kHz. Therefore, the binary code corresponding to number 171 may be stored in the register 316 as exemplified in the following table (with the small numbers in the first row of the table indicating the bit position in the register):

| 9 | 8 | 7 | 6 | 5 | 4 | 3 | 2 | 1 | 0 |
|---|---|---|---|---|---|---|---|---|---|
| 0 | 0 | 1 | 0 | 1 | 0 | 1 | 0 | 1 | 1 |

Once a first binary code is stored in the register 316, the frequency analysis procedure may progress as exemplified in FIG. 1, until a second faulty frequency is identified, e.g., at 3420 kHz. Thus, the following storage would be attempted:

| 21 | 20 | 19 | 18 | 17 | 16 | 15 | 14 | 13 | 12 |
|----|----|----|----|----|----|----|----|----|----|
| 0  | 1  | 0  | 1  | 0  | 1  | 0  | 1  | 1  | 0  |

The logic block 310 may be configured to check whether this new entry (binary code) is a multiple of any of the entries (binary codes) previously stored in the register. For instance, the logic block 310 may be configured to perform shift operations to check whether this new entry is a multiple of a power of 2 and any of the entries previously stored in the register.

In the present example, 342=171*2, therefore the value 342 above would not be stored. The same would happen for the value 684=171*4, and all other values which are obtainable as a product of a power of 2 (i.e., a number in the form 2N with N being an integer) and one of the values previously stored in the register 316.

The frequency analysis procedure 10 may end when a maximum number of frequency values has been stored, with such maximum number possibly depending on the depth of the register 316 (e.g., six values). For instance, at the end of the procedure 10, the following values may be stored in three registers SR7, SR8, SR9, which make up the register 316 (each register SR being 22 bit long):

| SR7 | 9 | 8 | 7 | 6 | 5 | 4 | 3 | 2 | 1 | 0 | 1710 kHz |
|-----|---|---|---|---|---|---|---|---|---|---|----------|
|     | 0 | 0 | 1 | 0 | 1 | 0 | 1 | 0 | 1 | 1 |          |

| SR7 | 21 | 20 | 19 | 18 | 17 | 16 | 15 | 14 | 13 | 12 | 2530 kHz |
|-----|----|----|----|----|----|----|----|----|----|----|----------|
|     | 0  | 0  | 1  | 1  | 1  | 1  | 1  | 1  | 0  | 1  |          |

| SR8 | 9 | 8 | 7 | 6 | 5 | 4 | 3 | 2 | 1 | 0 | 4670 kHz |
|-----|---|---|---|---|---|---|---|---|---|---|----------|
|     | 0 | 1 | 1 | 1 | 0 | 1 | 0 | 0 | 1 | 1 |          |

| SR8 | 21 | 20 | 19 | 18 | 17 | 16 | 15 | 14 | 13 | 12 | 6930 kHz |
|-----|----|----|----|----|----|----|----|----|----|----|----------|
|     | 1  | 0  | 1  | 0  | 1  | 1  | 0  | 1  | 0  | 1  |          |

| SR9 | 9 | 8 | 7 | 6 | 5 | 4 | 3 | 2 | 1 | 0 | 8020 kHz |
|---|---|---|---|---|---|---|---|---|---|---|---|
|  | 1 | 1 | 0 | 0 | 1 | 0 | 0 | 0 | 1 | 0 |  |

| SR9 | 21 | 20 | 19 | 18 | 17 | 16 | 15 | 14 | 13 | 12 | 10190 kHz |
|---|---|---|---|---|---|---|---|---|---|---|---|
|  | 1 | 1 | 1 | 1 | 1 | 1 | 1 | 0 | 1 | 1 |  |

Optionally, a second register 318 (e.g., an SPI register) may be provided coupled at the output of the ADC 314 for storing the values of amplitude of the faulty harmonics, in a similar way as previously described for the storage of the values of frequency. The ADC 314 may thus be configured to convert to digital both the value of frequency and the value of amplitude of the present harmonic.

In the presently considered example, the circuitry implementing the frequency analysis procedure and the noise compensation procedure is hosted in the device D comprising the CAN transceiver 300. In alternative embodiments, such circuitry may be only partially hosted in the device D (e.g., with only the ADC 314 and the oscillator circuit OSC1 being hosted in the device D, since they are already present), with some circuitry (e.g., the registers 316 and/or 318, the logic block 310, the frequency analyzer 312, the superheterodyne processing circuitry OSC2, 304, 306) being comprised in a separate device coupled to the same CAN bus B.

Figure 4:
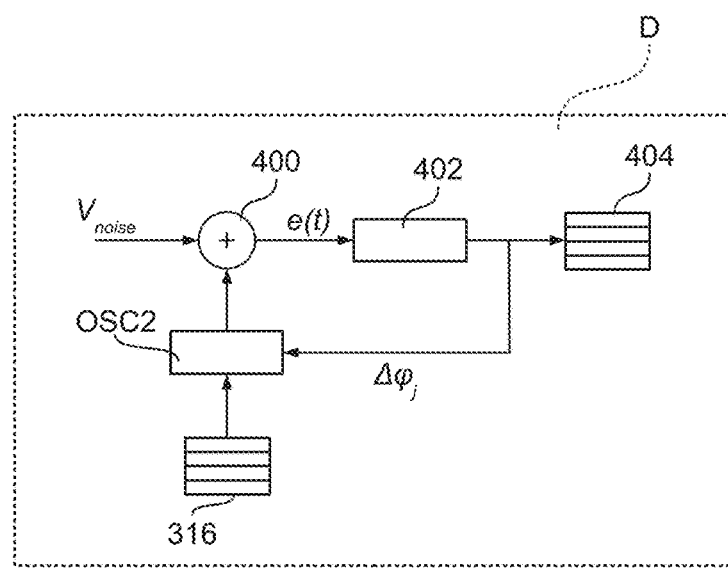

FIG. 4 is a circuit block diagram exemplary of possible implementation details of a circuit for adjusting the phase $\varphi_j$ of a generated compensation signal as exemplified in step 210 of a noise compensation procedure 20.

In particular, during a noise compensation procedure 20, the compensation sinusoidal signals may be generated by the same oscillator circuit OSC2 previously used during a frequency analysis procedure. The oscillator OSC2 may be configured to read from the register 316 the values of frequency stored therein, e.g. starting from a first value $f_j$, and optionally read from the register 318 the respective values of amplitude stored therein.

The oscillator OSC2 thus may generate a first compensation signal in the form $\sin(2\pi f_j t + \pi + \Delta\varphi)$, which may be summed to the corresponding faulty harmonic signal $V_{noise}$ by an adder circuit 400. At the output of the adder circuit 400, an error signal e(t) is thus generated, which should be minimized in order to provide better noise compensation.

In particular, a phase estimation circuit 402 may estimate the phase difference between the faulty harmonic signal and the corresponding compensation signal as a function of the value of the error signal e(t), with the aim of minimizing the phase uncertainty $\Delta\varphi$.

For instance, the phase estimation circuit 402 may comprise a mixer circuit for multiplying the compensation signal and the corresponding faulty harmonic so to generate an output signal having a continuous component having an amplitude proportional to (equal to) $\cos(\Delta\varphi)/2$.

Alternatively, the phase estimation circuit 402 may comprise a subtractor node for subtracting the compensation signal and the corresponding faulty harmonic one from the other so to generate an output signal having an amplitude proportional to $\Delta\varphi$.

The estimated phase difference may be stored in a third register 404 (e.g., an SPI register), and a feedback loop may act on the oscillator circuit OSC2 as a function of the estimated phase difference, in order to adjust the phase of the generated compensation signal to reduce the estimated phase difference.

In one or more embodiments, few iterations of the feedback loop may result in a negligible (i.e., almost zero) phase displacement leading to the compensation signal being in anti-phase with respect to the faulty harmonic, and therefore a satisfactory compensation of the faulty harmonic.

Therefore, a device D according to one or more embodiments may perform a frequency analysis routine at start-up (e.g., at start-up of a vehicle which hosts the device) to detect harmonics that do not comply with EMC requirements. Such frequency analysis routine (or procedure) may involve using one or more oscillators and an ADC which may be present in the device D for different purposes (e.g., to manage temperature signals during normal operation of the device), and storing data in dedicated registers, thereby resulting in a negligible impact on the design complexity of the device itself.

After completion of a frequency analysis procedure, a device according to one or more embodiments may perform (continuously) a noise compensation procedure by generating (e.g., with the same oscillator OSC2) compensation signals to be transmitted over the CAN bus coupled thereto, preferably implementing a feedback loop for the reduction of the phase displacement of the compensation signals.

In one or more embodiments, generation of plural compensation signals in the form $\sin(2\pi f_j t + \pi + \Delta\varphi)$ for different values of faulty frequency $f_j$ stored in the register 316 may involve:

determining a base frequency which divides all the values of faulty frequency stored, generating, at the oscillator OSC2, a sinusoidal signal at the base frequency, and generating plural compensation signals at different frequencies by applying frequency multiplication to the sinusoidal signal at the base frequency, e.g., by means of a configurable frequency multiplier circuit.

Without prejudice to the underlying principles, the details and embodiments may vary, even significantly, with respect to what has been described by way of example only, without departing from the extent of protection.

The extent of protection is defined by the annexed claims.

What is claimed is:

1. A method of compensating electromagnetic emissions of a device for use in a communication bus, the device comprising a transceiver coupling the device to the communication bus for transmitting and receiving signals, the method comprising:

transmitting a test signal over the communication bus;

receiving, at the device, the test signal after propagation over the communication bus;

performing frequency analysis processing of the test signal received to detect a set of harmonic components of the test signal received having an amplitude exceeding a certain threshold;

storing respective values of frequency of harmonic components in the set of harmonic components having an amplitude exceeding the certain threshold; and generating and transmitting over the communication bus a set of compensation signals, each compensation signal in the set of compensation signals being a sinusoidal signal having a respective frequency equal to one of the frequencies stored, and being in anti-phase with respect to the harmonic component of the test signal received having the respective frequency.

2. The method of claim 1, wherein the communication bus is a Controller Area Network (CAN) bus, and wherein the transceiver is a CAN transceiver.

3. The method of claim 1, wherein performing the frequency analysis processing comprises applying superheterodyne processing to the test signal received by:
sequentially generating a set of sinusoidal signals at different frequencies;
mixing each of the sinusoidal signals sequentially generated with the test signal received after propagation over the communication bus to sequentially generate a set of mixed signals; and
applying band-pass filtering at a fixed frequency to the mixed signals in the set of mixed signals to detect the set of harmonic components of the test signal received.

4. The method of claim 1, wherein storing respective values of frequency of harmonic components in the set of harmonic components having an amplitude exceeding the certain threshold comprises:
checking whether a new value of frequency candidate for storage is equal to $2^N*f_o$, wherein N is an integer and $f_o$ is any of the previously stored values of frequency, and
storing the new value of frequency candidate for storage as a result of the new value of frequency candidate for storage being different from $2^N*f_o$.

5. The method of claim 1, wherein storing respective values of frequency of harmonic components in the set of harmonic components comprises:
configuring an analog-to-digital converter in the device to receive at an input harmonic signals and to provide at an output a digital signal indicative of the respective values of frequency, and
storing the respective values of frequency in a register in the device.

6. The method of claim 5, further comprising:
checking whether the register in the device is full, and
terminating the frequency analysis processing as a result of the register in the device being full, or as a result of the frequency of a lastly generated sinusoidal signal in a set of sequentially generated sinusoidal signals being higher than a certain frequency threshold.

7. The method claim 1, wherein generating and transmitting over the communication bus the set of compensation signals comprises:
estimating a phase difference between at least one of the generated compensation signals and a corresponding one of the harmonic components of the test signal received, and
adjusting a phase of the at least one of the generated compensation signals as a function of the estimated phase difference to keep the at least one of the generated compensation signals in anti-phase with respect to the corresponding one of the harmonic components of the test signal received.

8. The method of claim 1, further comprising storing respective values of amplitude of harmonic components in the set of harmonic components of the test signal received having an amplitude exceeding the certain threshold, and wherein each compensation signal in the set of compensation signals transmitted over the communication bus has a respective amplitude which is a function of an amplitude of the corresponding harmonic component of the test signal received having the respective frequency.

9. The method of claim 8, wherein the respective amplitude is equal to the amplitude of the corresponding harmonic component of the test signal received having the respective frequency.

10. The method of claim 1, wherein the test signal is a square wave test signal at a frequency of 250 kHz and having a duty cycle of 50% and an amplitude between 0.1 µV and 10 µV.

11. The method of claim 10, wherein the test signal has an amplitude of about '1 µV.

12. The method of claim 10, wherein the test signal is generated in the device by:
generating, with an oscillator circuit, a sinusoidal signal having a frequency of 2 MHz,
performing frequency division of the sinusoidal signal having a frequency of 2 MHz, to generate a second sinusoidal signal having a frequency of 250 kHz, and
providing the second sinusoidal signal at an input of a comparator, the comparator configured to generate an output signal indicative of the sign of the second sinusoidal signal.

13. The method of claim 1, wherein the certain threshold is a ratio between the amplitude of the harmonic component of the test signal received and the amplitude of the test signal transmitted over the communication bus.

14. The method of claim 13, wherein the ratio is equal to about 55 dB.

15. The method of claim 1, wherein the steps of:
transmitting the test signal over the communication bus,
receiving the test signal after propagation over the communication bus,
performing frequency analysis processing of the test signal received, and
storing respective values of frequency of harmonic components in the set of harmonic components,
are performed at a start-up of the communication bus, and the step of generating and transmitting over the communication bus a set of compensation signals is performed continuously during operation of the communication bus.

16. A circuit for compensating electromagnetic emissions of a device for use in a CAN bus, the circuit comprising:
a test signal generation circuit configured to generate a test signal for the CAN bus;
a CAN transceiver configured to transmit the test signal over the CAN bus, and to receive the test signal after propagation over the CAN bus;
a frequency analysis processing circuit configured to detect a set of harmonic components of the test signal received having an amplitude exceeding a certain threshold;
a register configured to store respective values of frequency of harmonic components in the set of harmonic components having an amplitude exceeding the certain threshold; and
a compensation signal generating circuit configured to generate a set of compensation signals, each compensation signal in the set of compensation signals being a sinusoidal signal having a respective frequency equal to one of the frequencies stored, and being in anti-phase with respect to the harmonic component of the test signal received having the respective frequency.

17. The circuit of claim 16, wherein the test signal generation circuit comprises:
a first oscillator configured to generate a first sinusoidal signal at a certain first frequency;

a frequency divider circuit configured to receive the first sinusoidal signal and to generate a second sinusoidal signal based on the first sinusoidal signal at a certain second frequency that is lower than the certain first frequency; and a first comparator configured to generate a square wave test signal as a function of the second sinusoidal signal at the certain second frequency.

18. The circuit of claim 16, wherein the frequency analysis processing circuit comprises:

a second oscillator configured to sequentially generate a set of sinusoidal signals at different frequencies;

a mixer circuit configured to mix each of the sinusoidal signals sequentially generated with the test signal received after propagation over the CAN bus to sequentially generate a set of mixed signals;

a band-pass filter centered at a certain fixed frequency and configured to filter the mixed signals in the set of mixed signals to sequentially detect the set of harmonic components of the test signal received;

a second comparator configured to compare the amplitude of harmonic components in the set of harmonic components to a certain amplitude threshold;

an analog-to-digital converter having an input coupled to an output of the band-pass filter and configured to receive harmonic signals, and an output configured to provide a digital signal indicative of the respective values of frequency; and a register configured to store the respective values of frequency.

19. The circuit of claim 16, comprising a phase difference estimation circuit configured to estimate a phase difference between at least one of the generated compensation signals and a corresponding one of the harmonic components of the test signal received, wherein the compensation signal generating circuit is configured to adjust a phase of the at least one of the generated compensation signals as a function of the estimated phase difference to keep the at least one of the generated compensation signals in anti-phase with respect to the corresponding one of the harmonic components of the test signal received.

20. A device for use in a CAN bus, the device comprising:

a test signal generation circuit configured to generate a test signal for the CAN bus;

a CAN transceiver configured to transmit the test signal over the CAN bus, and to receive the test signal after propagation over the CAN bus;

a frequency analysis processing circuit configured to detect a set of harmonic components of the test signal received having an amplitude exceeding a certain threshold;

a register configured to store respective values of frequency of harmonic components in the set of harmonic components having an amplitude exceeding the certain threshold; and a compensation signal generating circuit configured to generate a set of compensation signals, each compensation signal in the set of compensation signals being a sinusoidal signal having a respective frequency equal to one of the frequencies stored, and being in anti-phase with respect to the harmonic component of the test signal received having the respective frequency.

* * * * *